United States Patent
Ohno et al.

(10) Patent No.: US 9,564,315 B1
(45) Date of Patent: Feb. 7, 2017

(54) MANUFACTURING METHOD AND APPARATUS FOR MANUFACTURING SILICON CARBIDE EPITAXIAL WAFER

(71) Applicant: Mitsubishi Electric Corporation, Tokyo (JP)

(72) Inventors: Akihito Ohno, Tokyo (JP); Masashi Sakai, Tokyo (JP); Yoichiro Mitani, Tokyo (JP); Takahiro Yamamoto, Tokyo (JP); Yasuhiro Kimura, Tokyo (JP); Takuma Mizobe, Tokyo (JP); Nobuyuki Tomita, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/091,421

(22) Filed: Apr. 5, 2016

(30) Foreign Application Priority Data

Aug. 5, 2015 (JP) .................................. 2015-155235

(51) Int. Cl.
| | |
|---|---|
| H01L 21/02 | (2006.01) |
| C23C 16/455 | (2006.01) |
| C23C 16/44 | (2006.01) |
| B08B 9/093 | (2006.01) |

(52) U.S. Cl.
CPC ......... *H01L 21/02529* (2013.01); *B08B 9/093* (2013.01); *C23C 16/4412* (2013.01); *C23C 16/455* (2013.01); *H01L 21/0262* (2013.01); *H01L 21/02378* (2013.01)

(58) Field of Classification Search
CPC combination set(s) only.
See application file for complete search history.

(56) References Cited

U.S. PATENT DOCUMENTS

| | | | |
|---|---|---|---|
| 2003/0094134 A1 | 5/2003 | Minami | |
| 2008/0099326 A1* | 5/2008 | Ye ........................ | C23C 14/0623 204/192.25 |
| 2012/0174859 A1* | 7/2012 | Sakamoto ............... | C30B 25/02 117/88 |
| 2015/0214049 A1* | 7/2015 | Kawada .................. | C30B 25/20 117/88 |
| 2016/0002574 A1* | 1/2016 | Oomori ............... | C23C 16/4405 134/19 |

FOREIGN PATENT DOCUMENTS

| | | |
|---|---|---|
| JP | HEI9-272978 A | 10/1997 |
| JP | 2003-158080 A | 5/2003 |
| JP | 2006-318959 A | 11/2006 |

(Continued)

*Primary Examiner* — Kyoung Lee
*Assistant Examiner* — Ratisha Mehta
(74) *Attorney, Agent, or Firm* — Studebaker & Brackett PC

(57) ABSTRACT

A manufacturing method for manufacturing a silicon carbide epitaxial wafer includes: introducing a cleaning gas into a growth furnace to remove dendrite-like polycrystal of silicon carbide attached to an inner wall of the growth furnace; after introducing the cleaning gas, bringing a silicon carbide substrate in the growth furnace; and growing a silicon carbide epitaxial layer on the silicon carbide substrate by introducing a processing gas into the growth furnace to manufacture a silicon carbide epitaxial wafer, wherein the cleaning gas having fluid energy of 1.6E-4 [J] or higher is introduced into the growth furnace.

7 Claims, 3 Drawing Sheets

(56) References Cited

FOREIGN PATENT DOCUMENTS

| | | |
|---|---|---|
| JP | 2008-159740 A | 7/2008 |
| JP | 2013-069818 A | 4/2013 |
| JP | 5542560 B2 | 5/2014 |
| JP | 2014-154865 A | 8/2014 |
| JP | WO 2014125893 A1 * | 8/2014 ......... C23C 16/4405 |

* cited by examiner ably grown on a SiC bulk monocrystal substrate by thermal chemical vapor deposition (thermal CVD) or the like. The term "active region" refers here to a region which is built by precisely controlling doping concentration in a crystal and its film thickness, and which has a section containing a growth direction axis. The reason why such an epitaxially grown layer is required as well as a bulk monocrystal substrate is that a doping concentration and a film thickness are generally prescribed in accordance with the specifications of a device and there is a demand for obtaining the doping concentration and the film thickness with accuracies higher than those attained for bulk monocrystal substrates in ordinary cases.

MANUFACTURING METHOD AND APPARATUS FOR MANUFACTURING SILICON CARBIDE EPITAXIAL WAFER

BACKGROUND OF THE INVENTION

Field of the Invention

The present invention relates to a manufacturing method and apparatus for manufacturing a silicon carbide epitaxial wafer.

Background Art

In recent years, a silicon carbide (hereinafter referred to as SiC) semiconductor has attracted attention mainly as a material for power devices for power control because its bandgap, dielectric breakdown electric field intensity, saturated drift speed and thermal conductivity are higher than those of silicon semiconductors. In fact, a power device using the SiC semiconductor is capable of largely reducing power loss, being reduced in size and realizing energy saving at the time of power supply power conversion and can therefore be a key device for, for example, improving the performance of electric vehicles and improving the functions of solar battery systems or the like in realization of a low-carbon society.

In making a SiC power device, a layer to be provided as an active region of the semiconductor device is generally grown epitaxially on a SiC bulk monocrystal substrate by thermal chemical vapor deposition (thermal CVD) or the like. The term "active region" refers here to a region which is built by precisely controlling doping concentration in a crystal and its film thickness, and which has a section containing a growth direction axis. The reason why such an epitaxially grown layer is required as well as a bulk monocrystal substrate is that a doping concentration and a film thickness are generally prescribed in accordance with the specifications of a device and there is a demand for obtaining the doping concentration and the film thickness with accuracies higher than those attained for bulk monocrystal substrates in ordinary cases.

A wafer having an epitaxially grown layer formed on a SiC bulk monocrystal substrate will hereinafter be referred to as "epitaxial wafer". A silicon carbide semiconductor device is fabricated by performing various kinds of processing on a silicon carbide epitaxial wafer. If the silicon carbide epitaxial wafer has defects, the silicon carbide semiconductor device locally fails to hold a high voltage, resulting in generation of a leak current. If the density of such defects is increased, the nondefective rate in manufacturing of the silicon carbide semiconductor device is reduced.

When the silicon carbide epitaxial wafer is manufactured, silicon carbide is attached not only to the wafer but also to inner walls of a growth furnace and to surfaces of a wafer holder on which the wafer is mounted. The attached silicon carbide is structurally brittle and can therefore form silicon carbide particles easily. If silicon carbide particles are attached to the wafer surface, crystal defects such as downfalls and triangular defects are generated starting from the attachment points.

As a method for reducing silicon carbide particles which can be a cause of such crystal defects, a method of cleaning the wafer holder by etching silicon carbide particles attached to the wafer holder with chlorine trifluoride has been proposed (see, for example, Japanese Patent No. 5542560). A method of removing silicon carbide particles by using a cleaning gas containing iodine heptafluoride without etching and damaging graphite which is the basic material of a certain member has also been proposed (see, for example, Japanese Patent Laid-Open No. 2014-154865).

In the case of the method disclosed in Japanese Patent No. 5542560, not only the attached silicon carbide but also the silicon carbide film formed as protective film on internal members of the growth furnace and the wafer holder is etched and it is, therefore, difficult to perform cleaning management. Also, special expelling equipment is required to enable use of chlorine trifluoride, for example, because it corrodes the apparatus and piping. The method thus entails problems in terms of operation and cost. Further, because the rate of etching of silicon carbide is lower than that of etching of silicon, a long time is taken to complete cleaning and it is difficult to completely remove silicon carbide.

In the case of the method disclosed in Japanese Patent Laid-Open No. 2014-154865, iodine heptafluoride, which does not etch graphite, is used but the silicon carbide film formed as protective film on the wafer holder and internal members of the growth furnace are thereby etched, as in the case of the method disclosed in Japanese Patent No. 5542560, and it is difficult to perform cleaning management. Thus, use of a fluorine-based gas as cleaning gas entails the problem of members other than the attached silicon carbide being etched.

SUMMARY OF THE INVENTION

In view of the above-described problem, an object of the present invention is to provide a manufacturing method and apparatus for manufacturing a silicon carbide epitaxial wafer with reduced crystal defects while avoiding damaging internal members of the growth furnace and the wafer holder.

According to the present invention, a manufacturing method for manufacturing a silicon carbide epitaxial wafer includes: introducing a cleaning gas into a growth furnace to remove silicon carbide in polycrystalline form of dendrite-like structure attached to an inner wall of the growth furnace; after introducing the cleaning gas, bringing a silicon carbide substrate in the growth furnace; and growing a silicon carbide epitaxial layer on the silicon carbide substrate by introducing a processing gas into the growth furnace to manufacture a silicon carbide epitaxial wafer, wherein the cleaning gas having fluid energy of 1.6E-4 [J] or higher is introduced into the growth furnace.

In the present invention, a cleaning gas having fluid energy of 1.6E-4 [J] or higher is introduced into the growth furnace. Therefore, the silicon carbide epitaxial wafer with reduced crystal defects can be manufactured without damaging the internal members of the growth furnace and the wafer holder.

Other and further objects, features and advantages of the invention will appear more fully from the following description.

DETAILED DESCRIPTION OF THE PREFERRED EMBODIMENTS

A manufacturing method and apparatus for manufacturing a silicon carbide epitaxial wafer according to the embodiments of the present invention will be described with reference to the drawings. The same components will be denoted by the same symbols, and the repeated description thereof may be omitted.

First Embodiment

Figure 1:
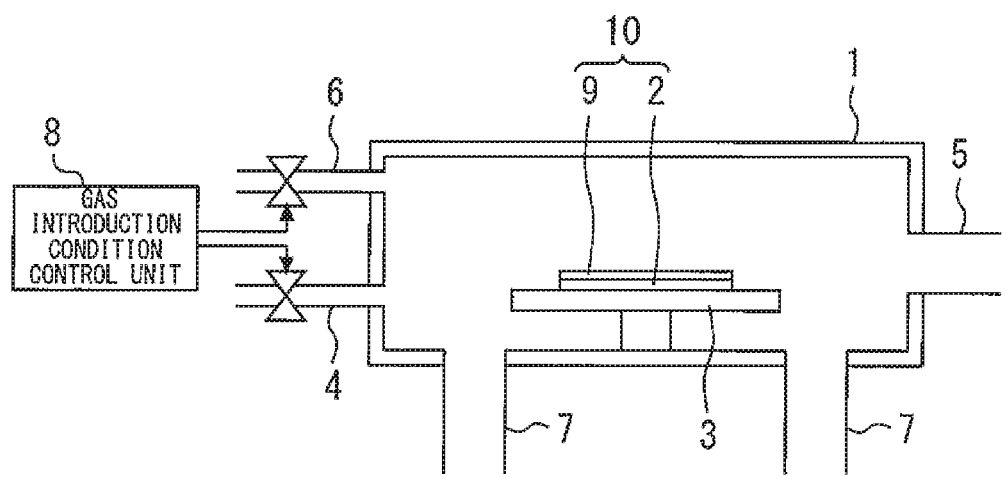
FIG. 1 is a sectional view of an apparatus for manufacturing a silicon carbide epitaxial wafer according to a first embodiment of the present invention.

FIG. 1 is a sectional view of an apparatus for manufacturing a silicon carbide epitaxial wafer according to a first embodiment of the present invention. A wafer holder 3 on which a silicon carbide substrate 2 is mounted is provided in a growth furnace 1 (epitaxial growth furnace) in which epitaxial growth is performed. A processing gas introduction port 4 introduces a processing gas including a carrier gas and a raw-material gas into the growth furnace 1 in an epitaxial growth step. A processing gas exhaust port 5 discharges from the growth furnace 1 the processing gas introduced through the processing gas introduction port 4.

A cleaning gas introduction port 6 introduces, into the growth furnace 1, in a cleaning step, a cleaning gas for removing silicon carbide in polycrystalline form of dendrite-like structure attached to inner wall surfaces of the growth furnace 1. Gas exhaust ports 7 discharge from the growth furnace 1 the cleaning gas introduced through the cleaning gas introduction port 6. A gas introduction condition control unit 8 controls a gas flow rate controller and a pressure controller connected to the processing gas introduction port 4 and the cleaning gas introduction port 6, thereby controlling conditions for introduction of the processing gas and the cleaning gas (the gas flow rate and pressure) in the cleaning step or the epitaxial step. The cleaning gas introduction port 6 is connected to a cleaning gas bomb (not shown) through the gas introduction condition control unit 8.

Figure 2:
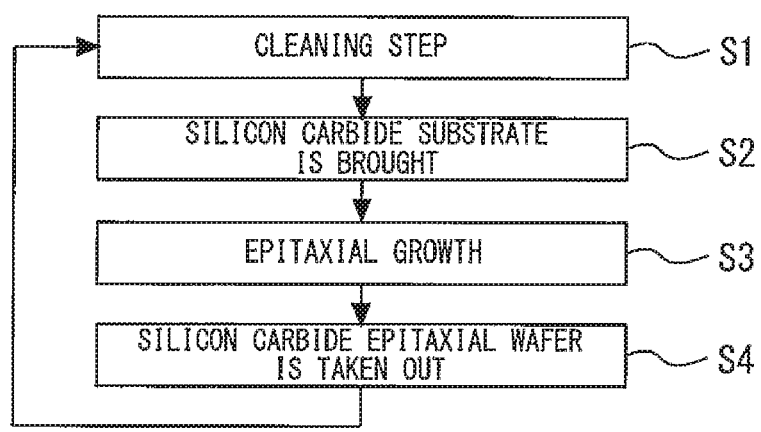
FIG. 2 is a flowchart showing a process of manufacturing the silicon carbide epitaxial wafer according to the first embodiment of the present invention.

FIG. 2 is a flowchart showing a process of manufacturing the silicon carbide epitaxial wafer according to the first embodiment of the present invention. The silicon carbide epitaxial wafer manufacturing process will be described below with reference to FIGS. 1 and 2.

First, in a state where the wafer holder 3 is set in the growth furnace 1, the cleaning gas is introduced into the growth furnace 1, thereby removing silicon carbide in polycrystalline form of dendrite-like structure attached to the inner wall of the growth furnace 1 and the wafer holder 3 (step S1). This step is called a cleaning step. In a case where cleaning of the wafer holder 3 is unnecessary, the wafer holder 3 may be placed out of the growth furnace 1 at this stage. Conditions for introduction of the cleaning gas in the cleaning step are described below.

Next, the silicon carbide substrate 2 is brought in the growth furnace 1 by being mounted on the wafer holder 3 (step S2). Subsequently, a silicon carbide epitaxial layer 9 is grown on the silicon carbide substrate 2 by introducing the processing gas into the growth furnace 1, thereby manufacturing a silicon carbide epitaxial wafer 10 (step S3). The completed silicon carbide epitaxial wafer 10 is thereafter taken out of the growth furnace 1 (step S4). The silicon carbide epitaxial wafer 10 is manufactured by the above-described steps.

The significance of the cleaning step will now be described. While the silicon carbide epitaxial layer 9 is grown on the silicon carbide substrate 2 in the epitaxial growth step, silicon carbide is simultaneously attached to the inner wall surfaces of the growth furnace 1 and the wafer holder 3 and grown in polycrystalline form of dendrite-like structure. Structurally weak thin portions of the silicon carbide in polycrystalline form are cut and separated due to fluctuation of the gas flow at the time of introduction of the processing gas, thereby generating silicon carbide particles. If the silicon carbide particles are not removed (by cleaning), the silicon carbide particles are scattered in the growth furnace 1 to be attached to the epitaxial growth surface of the silicon carbide epitaxial wafer 10 in the subsequent epitaxial growth step due to fluctuation of the flow of the introduced gas. The attachment of silicon carbide particles entails generation of crystal defects. The cleaning step (step S1) is a step for avoiding such an event.

Conditions for introduction of the cleaning gas in the cleaning step will subsequently be described. Fluid energy of the gas will first be described. Fluid energy represents the total amount of energy of the gas in the cleaning step. If the total mass of the gas caused to flow in the cleaning step is m [kg] and the velocity of flow of the gas in this situation is v [m/s], the fluid energy E is defined by the following expression 1.

[Expression 1]

$$E = \frac{1}{2}mv^2 \quad [J]$$

The total mass m of the gas is determined by the kind of the gas and the total rate of flow of the gas, and the flow velocity v is calculated from the gas flow rate, the sectional area of the growth furnace 1 and the pressure in the growth furnace 1.

Figure 3:
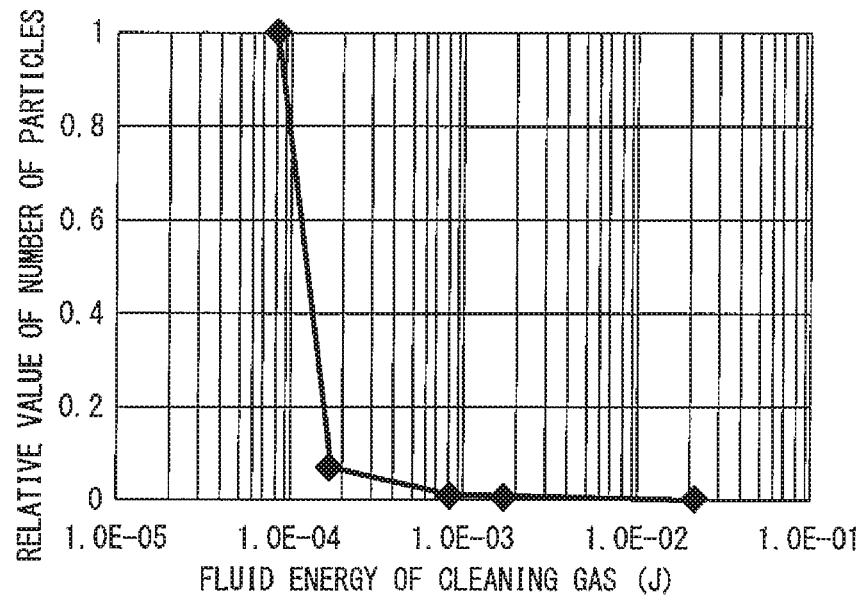
FIG. 3 is a diagram showing the relationship between the fluid energy of the cleaning gas in the growth furnace and a relative value of the number of particles remaining in the growth furnace.

FIG. 3 is a diagram showing the relationship between the fluid energy of the cleaning gas in the growth furnace and a relative value of the number of particles remaining in the growth furnace. After the cleaning gas controlled at a certain level of fluid energy is introduced into the growth furnace 1, a silicon wafer, for example, is brought in the growth furnace 1, and argon gas, for example, is introduced. The silicon wafer is thereafter taken out. Particles deposited on the silicon wafer taken out are counted with a particle counter to obtain the "number of remaining particles". The ordinate of FIG. 3 represents a relative number of remaining particles assuming that the number of particles remains when the fluid energy is 8.0E-5 [J] is unity. Referring to FIG. 3, the relative value of the number of particles is abruptly reduced to 0.08 or less when the fluid energy is 1.6E-4 [J]. This shows that silicon carbide attached to the inner wall surfaces of the growth furnace 1 and the wafer holder 3 can be removed by fluid energy of 1.6E-4 [J] or higher. When the fluid energy is 8.1E-4 [J], the relative value of the number of particles can be further reduced to 0.015 or less. Further, when the fluid energy is 2.0E-2 [J], the relative value of the number of particles can be reduced to 0.005 or less. No particular upper limit value of fluid energy is specified here. If the fluid energy is higher than 1.0[E]-1 [J] in the case of an ordinary growth furnace, however, the cleaning step time is considerably long and there is a possibility of a reduction in productivity. It is, therefore, preferable that the fluid energy be equal to or higher than 1.0E-1 [J].

In the present embodiment, therefore, a cleaning gas having fluid energy of 1.6E-4 [J] or higher with respect to the total amount of gas in the cleaning step (step S1) is introduced into the growth furnace 1 in the cleaning step. At this time, the gas introduction condition control unit 8 controls the fluid energy of the cleaning gas at 1.6E-4 [J] or higher. By performing this cleaning step, silicon carbide in in polycrystalline form of dendrite-like structure attached to the inner wall surfaces of the growth furnace 1 and the wafer holder 3 can be removed before the epitaxial step. Therefore, substantially no silicon carbide particles are generated at the time of introduction of the processing gas in the epitaxial growth step. The silicon carbide epitaxial wafer 10 in which crystal defects due to silicon carbide particles are largely reduced can thus be formed.

The cleaning gas is an inert gas such as argon gas or nitrogen gas, or hydrogen gas. Since the cleaning gas is not an etching gas which etches silicon carbide, there is no apprehension of etching of the silicon carbide film formed as a protective film on the internal members of the growth furnace 1 and the wafer holder 3 in the cleaning step, and the facility with which the process is managed is improved. The present embodiment thus demonstrates that the silicon carbide epitaxial wafer 10 with reduced crystal defects can be manufactured without damaging the internal members of the growth furnace 1 and the wafer holder 3. Further, a silicon carbide device having reduced crystal defects, low-priced and producible at a high yield rate can be made by using the silicon carbide epitaxial wafer 10.

The mount surface of the wafer holder 3 is opposed to the ceiling surface of the growth furnace 1. Silicon carbide attached to the ceiling surface (upper surface) of the growth furnace 1 in such a position as to be opposed to the epitaxial growth surface of the silicon carbide epitaxial wafer 10 can easily become a cause of the crystal defects in comparison with silicon carbide attached to other portions of the growth furnace 1. Also, the amount of silicon carbide attached to the ceiling surface of the growth furnace 1 is larger than the amount of silicon carbide attached to the other portions of the growth furnace 1. There is, therefore, a need to perform cleaning particularly effectively on the ceiling surface. The cleaning gas introduction port 6 is therefore provided in the side of the growth furnace 1 at a position higher than that of the wafer holder 3 such that the cleaning gas flows along the ceiling surface of the growth furnace 1. As a result, silicon carbide attached to the ceiling surface opposed to the epitaxial growth surface of the silicon carbide epitaxial wafer 10 can be efficiently removed in a short time.

The cleaning gas exhaust ports 7 are gas exhaust ports for the cleaning gas only, provided for the purpose of collecting silicon carbide particles in the cleaning step. The processing gas for epitaxial growth flows in a horizontal direction (a left-right direction along the plane of FIG. 1) in the growth furnace 1. The processing gas exhaust port 5 is therefore provided opposite from the processing gas introduction port 4. In this case, silicon carbide particles not having reached the processing gas exhaust port 5 stay on the bottom surface of the growth furnace 1 instead of being collected. The silicon carbide particles staying on the bottom surface of the growth furnace 1 is flung up at the time of introduction of the processing gas for epitaxial growth and attached to the epitaxial growth surface of the silicon carbide epitaxial wafer 10 to become a cause of crystal defects. The cleaning gas exhaust ports 7 are therefore provided in the bottom surface of the growth furnace 1. With this arrangement, silicon carbide particles that have not reached the processing gas exhaust port 5 and stay on the bottom surface of the growth furnace 1 can be efficiently collected. As a result, silicon carbide particles are not flung up at the time of introduction of the processing gas for epitaxial growth, thus enabling reducing crystal defects. The cleaning gas exhaust ports 7 can be used simultaneously with the processing gas exhaust port 5, and components including a vacuum pump and a pressure regulation valve can also be used at the time of exhaust through the cleaning gas exhaust ports 7.

Second Embodiment

Figure 4:
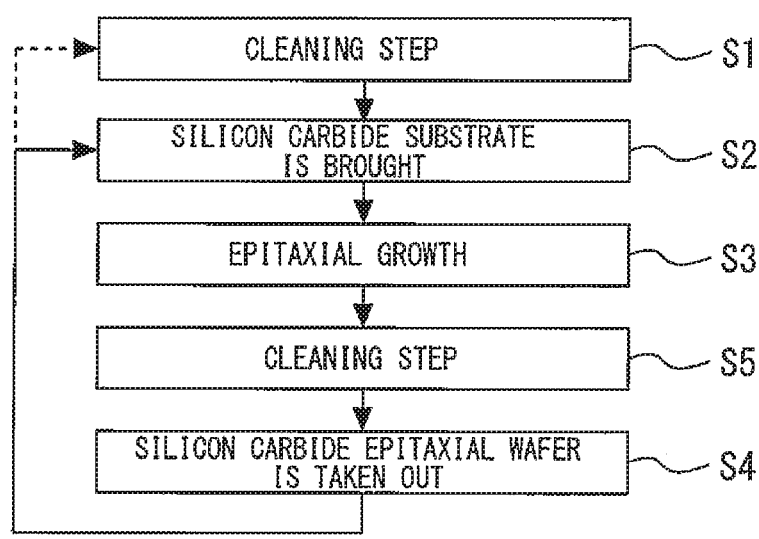
FIG. 4 is a flowchart showing a silicon carbide epitaxial wafer manufacturing process according to a second embodiment of the present invention.

FIG. 4 is a flowchart showing a silicon carbide epitaxial wafer manufacturing process according to a second embodiment of the present invention. The same manufacturing apparatus as that in the first embodiment is used for the manufacturing process in the second embodiment.

First, a cleaning step (step S1), a silicon carbide substrate 2 transport step (step S2) and an epitaxial growth step (step S3) are carried out, as those in the first embodiment, thereby forming the silicon carbide epitaxial wafer 10. These steps are the same as those in the first embodiment and detailed descriptions of them will not be repeated. After silicon carbide in polycrystalline form of dendrite-like structure attached to the inner wall surfaces of the growth furnace 1 and the wafer holder 3 is removed in the cleaning step (step S1), the epitaxial growth step (step S3) is executed. Therefore, substantially no silicon carbide particles are generated in the epitaxial growth step. The silicon carbide epitaxial wafer 10 in which crystal defects due to silicon carbide particles are largely reduced can thus be formed.

Next, the cleaning step is executed without taking out the completed silicon carbide epitaxial wafer 10 (step S5). The completed silicon carbide epitaxial wafer 10 is thereafter taken out from the growth furnace 1 (step S4). In the cleaning step (step S5), not an etching gas which etches silicon carbide but a cleaning gas having fluid energy of 1.6E-4 [J] or higher is introduced into the growth furnace 1, as in the cleaning step (step S1) in the first embodiment.

In the first embodiment, the cleaning step is executed after the completed silicon carbide epitaxial wafer 10 is taken out from the growth furnace 1. In the present embodiment, the cleaning step is executed while the silicon carbide epitaxial wafer 10 is left in the state of being set on the growth furnace 1. There is a possibility of silicon carbide particles being attached to the silicon carbide epitaxial wafer 10 in this case. However, since this particle attachment occurs after the completion of the epitaxial growth, the attachment silicon carbide particles cannot be a cause of crystal defects. As a result, the silicon carbide epitaxial wafer 10 with reduced crystal defects can be manufactured without damaging the internal members of the growth furnace 1 and the wafer holder 3.

Figure 5:
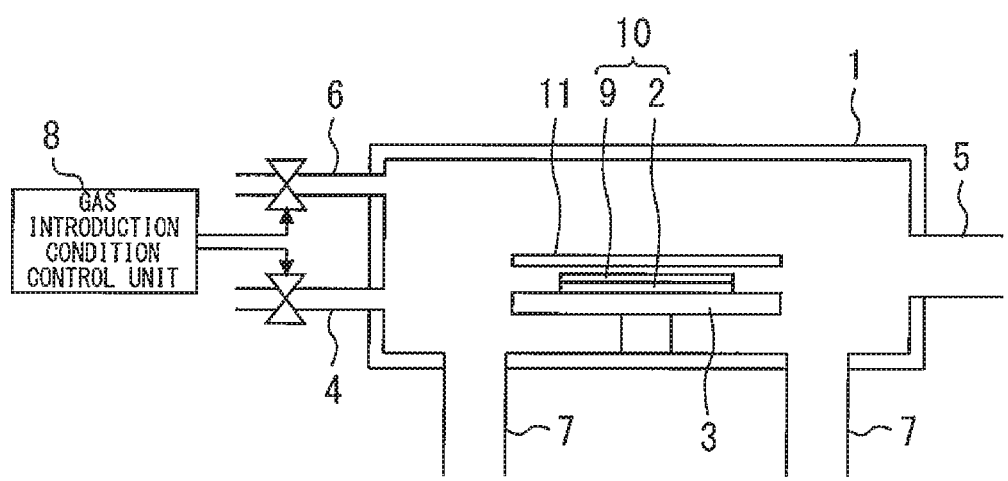
FIG. 5 is a sectional view of a modified example of the silicon carbide epitaxial wafer manufacturing apparatus according to the second embodiment of the present invention.

FIG. 5 is a sectional view of a modified example of the silicon carbide epitaxial wafer manufacturing apparatus according to the second embodiment of the present invention. In a case where the cleaning step is executed while the silicon carbide epitaxial wafer 10 is left in the state of being set on the growth furnace 1, a manufacturing apparatus having a shutter 11 on the silicon carbide substrate 2 as shown in FIG. 5 may be used. The shutter 11 does not cover the silicon carbide substrate 2 in the epitaxial step (step S3). The shutter 11 is disposed on the silicon carbide epitaxial wafer 10 only in the cleaning step (step S5) in which the cleaning gas is introduced into the growth furnace 1, thus enabling prevention of attachment of silicon carbide particles on the silicon carbide epitaxial wafer 10.

A cyclic purge to replace the growth gas in the growth furnace 1 with an inert gas is typically performed before the silicon carbide epitaxial wafer 10 having undergone the epitaxial process is taken out. The cleaning step (step S5) and a cyclic purge may therefore be combined. The influence of the cleaning step on the manufacturing tact can be reduced thereby.

In the descriptions of the first and second embodiments, applicable forms of the present invention are illustrated. The present invention is not limited to the described forms. Modifications and omissions can be made to the embodiments in the scope of the present invention as desired, and the embodiments can be freely combined. For example, the process can be changed as indicated by a broken-line arrow in FIG. 4.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2015-155235, filed on Aug. 5, 2015 including specification, claims, drawings and summary, on which the Convention priority of the present application is based, is incorporated herein by reference in its entirety.

What is claimed is:

1. A manufacturing method for manufacturing a silicon carbide epitaxial wafer comprising:
    introducing a cleaning gas into a growth furnace to remove dendrite-like polycrystal of silicon carbide attached to an inner wall of the growth furnace;
    after introducing the cleaning gas, bringing a silicon carbide substrate in the growth furnace; and
    growing a silicon carbide epitaxial layer on the silicon carbide substrate by introducing a processing gas into the growth furnace to manufacture a silicon carbide epitaxial wafer,
    wherein the cleaning gas having fluid energy of 1.6E-4 [J] or higher is introduced into the growth furnace, and
    wherein the cleaning gas includes only an inert gas, only hydrogen, or only a combination of an inert gas and hydrogen.

2. A manufacturing method for manufacturing a silicon carbide epitaxial wafer comprising:
    bringing a silicon carbide substrate in a growth furnace;
    growing a silicon carbide epitaxial layer on the silicon carbide substrate by introducing a processing gas into the growth furnace to manufacture a silicon carbide epitaxial wafer, and
    introducing a cleaning gas into the growth furnace to remove dendrite-like polycrystal of silicon carbide attached to an inner wall of the growth furnace,
    wherein the cleaning gas having fluid energy of 1.6E-4 [J] or higher is introduced into the growth furnace, and
    wherein the cleaning gas includes only an inert gas, only hydrogen, or only a combination of an inert gas and hydrogen.

3. The manufacturing method for manufacturing a silicon carbide epitaxial wafer of claim 2, wherein a shutter is disposed on the silicon carbide epitaxial wafer when the cleaning gas is introduced into the growth furnace.

4. A manufacturing apparatus for manufacturing a silicon carbide epitaxial wafer comprising:
    a growth furnace in which epitaxial growth is performed;
    a wafer holder provided in the growth furnace and on which a silicon carbide substrate is mounted;
    a processing gas introduction port introducing a processing gas into the growth furnace;
    a processing gas exhaust port discharging the processing gas from the growth furnace;
    a cleaning gas introduction port introducing, into the growth furnace, a cleaning gas for removing dendrite-like polycrystal of silicon carbide attached to an inner wall surface of the growth furnace; and
    a cleaning gas exhaust port discharging the cleaning gas from the growth furnace,
    wherein the cleaning gas having fluid energy of 1.6E-4 [J] or higher is introduced into the growth furnace through the cleaning gas introduction port, and
    wherein the cleaning gas includes only an inert gas, only hydrogen, or only a combination of an inert gas and hydrogen.

5. The manufacturing apparatus for manufacturing a silicon carbide epitaxial wafer of claim 4, wherein a mount surface of the wafer holder is opposed to a ceiling surface of the growth furnace, and
    the cleaning gas introduction port is provided in a side of the growth furnace at a position higher than the wafer holder such that the cleaning gas flows along the ceiling surface of the growth furnace.

6. The manufacturing apparatus for manufacturing a silicon carbide epitaxial wafer of claim 4, wherein the cleaning gas exhaust port is provided in a bottom surface of the growth furnace.

7. The manufacturing apparatus for manufacturing a silicon carbide epitaxial wafer of claim 4, further comprising a shutter disposed on the silicon carbide epitaxial wafer when the cleaning gas is introduced into the growth furnace.

* * * * *